United States Patent [19]
Yu

[11] Patent Number: 6,087,235
[45] Date of Patent: Jul. 11, 2000

[54] METHOD FOR EFFECTIVE FABRICATION OF A FIELD EFFECT TRANSISTOR WITH ELEVATED DRAIN AND SOURCE CONTACT STRUCTURES

[75] Inventor: Bin Yu, Sunnyvale, Calif.

[73] Assignee: Advanced Micro Devices, Inc., Sunnyvale, Calif.

[21] Appl. No.: 09/418,276

[22] Filed: Oct. 14, 1999

[51] Int. Cl.[7] .................................................. H01L 21/336
[52] U.S. Cl. ............................................ 438/300; 438/303
[58] Field of Search .................................... 438/299, 300, 438/301, 303, 305, 306

[56] References Cited

U.S. PATENT DOCUMENTS

| | | | |
|---|---|---|---|
| 5,079,180 | 1/1992 | Rodder et al. | 438/300 |
| 5,677,214 | 10/1997 | Hsu | 438/300 |
| 5,967,794 | 10/1999 | Kodama | 438/300 |

*Primary Examiner*—Charles Bowers
*Assistant Examiner*—Jack Chen
*Attorney, Agent, or Firm*—Monica H. Choi

[57] ABSTRACT

A field effect transistor is fabricated to have elevated drain and source contact structures with prevention of short-channel effects and leakage current which may result due to the formation of facetted surfaces on the elevated drain and source contact structures near the gate of the field effect transistor. The field effect transistor includes a drain extension implant, a source extension implant, a gate dielectric, a gate structure disposed over the gate dielectric, and a first spacer disposed on sidewalls of the gate dielectric and of the gate structure. An elevated drain contact structure is selectively grown on the drain extension implant and has a drain facetted surface facing toward the first spacer on the sidewall of the gate structure. Similarly, an elevated source contact structure is selectively grown on the source extension implant and has a source facetted surface facing toward the first spacer on the sidewall of the gate structure. A second spacer is formed to cover the drain facetted surface and the source facetted surface before dopant implantation into and silicide formation on the elevated drain and source contact structures. In this manner, the dopant is prevented from being implanted into the drain facetted surface and the source facetted surface such that short-channel effects are minimized in the field effect transistor of the present invention. In addition, formation of silicide on the drain facetted surface and the source facetted surface is prevented to minimize leakage current through the drain and source extension implants of the field effect transistor of the present invention.

8 Claims, 5 Drawing Sheets

6,087,235

METHOD FOR EFFECTIVE FABRICATION OF A FIELD EFFECT TRANSISTOR WITH ELEVATED DRAIN AND SOURCE CONTACT STRUCTURES

TECHNICAL FIELD

The present invention relates generally to fabrication of field effect transistors, and more particularly, to a method for fabricating a field effect transistor having drain and source extension implants and having elevated drain and source contact structures for effectively scaling down the dimensions of the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The conventional scaled down MOSFET 100 having submicron or nanometer dimensions includes a drain extension implant 104 and a source extension implant 106. The drain extension implant 104 and the source extension implant 106 are shallow junction implants to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 which is comprised typically of silicon dioxide (SiO$_2$), and a gate structure 118 which is typically a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116. The spacer 122 covers the separation of the drain extension implant 104 and the drain contact junction 108, and the separation of the source extension implant 106 and the source contact junction 112.

Referring to FIG. 2, in the MOSFET 100 of the prior art, when the width 126 of the spacer 122 is narrow, the deeper drain contact junction 108 and the deeper source contact junction 112 are closer to the channel region 128 of the MOSFET 100 resulting in a punch-through effect in the channel region 128, as known to one of ordinary skill in the art of integrated circuit fabrication. Such a punch-through effect may disadvantageously cause excessive leakage current through the MOSFET 100. (Elements having the same reference number in FIGS. 1 and 2 refer to elements having similar structure and function.)

On the other hand, referring to FIG. 3, in the MOSFET 100 of the prior art, when the width 126 of the spacer 122 is wide, the drain contact junction 108 and the source contact junction 112 are further apart, but the series resistance at the drain and the source of the MOSFET 100 is larger, as known to one of ordinary skill in the art of integrated circuit fabrication. Such a larger resistance degrades the drive current through the MOSFET 100 and thus degrades the speed performance of the MOSFET 100. (Elements having the same reference number in FIGS. 1, 2, and 3 refer to elements having similar structure and function.)

Because of these disadvantages of the drain contact junction 108 and the source contact junction 112 of the prior art, elevated drain and source contact structures are used to replace the drain contact junction 108 and the source contact junction 112, as known to one of ordinary skill in the art of integrated circuit fabrication. Referring to FIG. 4, for fabrication of the elevated drain and source contact structures in the prior art, a gate dielectric 202 which is comprised typically of silicon dioxide (SiO$_2$), and a gate structure 204 which is typically a polysilicon gate is formed on the surface of the semiconductor substrate 102. A drain extension implant 206 and a source extension implant 208 are then formed in the semiconductor substrate 102 to have a relatively large area such that elevated drain and source contact structures may be selectively grown thereon.

Referring to FIGS. 4 and 5, a first spacer 210 is formed on the sidewalls of the gate structure 204 and the gate dielectric 202. (Elements having the same reference number in FIGS. 4 and 5 refer to elements having similar structure and function.) The first spacer 210 is typically comprised of silicon nitride (SiN), and in that case, a spacer liner oxide 212 is deposited as a buffer layer between the first spacer 210 and the sidewalls of the gate structure 204 and the gate dielectric 202, and between the first spacer 210 and the surface of the drain extension implant 206 and the source extension implant 208, as illustrated in FIG. 5.

Referring to FIG. 6, an elevated drain contact structure 214 is grown onto the exposed portions of the drain extension implant 206 typically by selective epitaxial growth when the elevated drain contact structure 214 is comprised of silicon. Similarly, an elevated source contact structure 216 is grown onto the exposed portions of the source extension implant 208 typically by selective epitaxial growth when the elevated source contact structure 216 is comprised of silicon.

Referring to FIG. 6, during the selective epitaxial growth of the elevated drain contact structure 214, a drain facetted surface 218 forms on the elevated drain contact structure 214 due to the crystalline structure of the elevated drain contact structure 214. (Elements having the same reference number in FIGS. 4, 5, and 6 refer to elements having similar structure and function.) The drain facetted surface 218 faces toward the first spacer 210 on the sidewall of the gate structure 204. Similarly, a source facetted surface 220 forms on the elevated source contact structure 216 due to the crystalline structure of the elevated source contact structure 216. The source facetted surface 220 faces toward the first spacer 210 on the sidewall of the gate structure 204.

After formation of the elevated drain contact structure 214 and the elevated source contact structure 216, dopants are implanted and activated into the elevated drain contact structure 214 and the elevated source contact structure 216, as known to one of ordinary skill in the art of integrated circuit fabrication. Then, silicide is formed on the elevated drain contact structure 214 and the elevated source contact structure 216, as known to one of ordinary skill in the art of integrated circuit fabrication.

However, unfortunately in the prior art, when dopant is implanted and activated into the drain facetted surface 218 and the source facetted surface 220, such dopant may reach down into the semiconductor substrate creating locally deep junctions since the elevated drain contact structure 214 and the elevated source contact structure 216 are thinner at the drain facetted surface 218 and the source facetted surface 220. Such locally deep junctions under the drain facetted surface 218 and the source facetted surface 220 disadvantageously alter the drain extension implant 206 and the source extension implant 208 which are designed to be especially shallow in scaled down MOSFETs to prevent short-channel effects. Thus, locally deep junctions under the drain facetted surface 218 and the source facetted surface 220 cause recurrence of short-channel effects in the MOSFET of the prior art.

In addition, silicide formed on the drain facetted surface 218 and the source facetted surface 220 would be closer to the drain extension implant 206 and the source extension implant 208 since the elevated drain contact structure 214 and the elevated source contact structure 216 are thinner at the drain facetted surface 218 and the source facetted surface 220. Such a close location of the silicide at the drain facetted surface 218 and the source facetted surface 220 to the drain extension implant 206 and the source extension implant 208 respectively results in severe junction leakage current through the drain extension implant 206 and the source extension implant 208.

Despite these disadvantages, elevated drain and source contact structures are desired for further scaling down MOSFETs to submicron and nanometer dimensions. Thus, a process is desired for fabricating a MOSFET having the elevated drain and source contact structures with prevention of dopant implant and silicide formation at the drain facetted surface 218 and the source facetted surface 220.

Furthermore, referring to FIG. 6, during the selective epitaxial growth of the elevated drain contact structure 214 and the elevated source contact structure 216, a mushroom cap 222 may form on top of the gate structure 204 which may be comprised of polysilicon. A process is desired for effectively preventing the gate structure 204 from turning into such a mushroom shape.

SUMMARY OF THE INVENTION

Accordingly, in a general aspect of the present invention, a field effect transistor is fabricated to have elevated drain and source contact structures with prevention of dopant implant and silicide formation at the facetted surfaces of the elevated drain and source contact structures. The field effect transistor includes a drain extension implant, a source extension implant, a gate dielectric, a gate structure disposed over the gate dielectric, and a first spacer disposed on sidewalls of the gate dielectric and of the gate structure.

In one embodiment of the present invention, an elevated drain contact structure is selectively grown on the drain extension implant. The elevated drain contact structure has a drain facetted surface facing toward the first spacer on the sidewall of the gate structure. Similarly, an elevated source contact structure is selectively grown on the source extension implant. The elevated source contact structure has a source facetted surface facing toward the first spacer on the sidewall of the gate structure. A second spacer is formed to cover the drain facetted surface and the source facetted surface.

After the second spacer is formed to cover the drain facetted surface and the source facetted surface, the elevated drain contact structure and the elevated source contact structure that are exposed are doped with a dopant. The dopant is then activated within the elevated drain contact structure and the elevated source contact structure. Silicide is also formed on the elevated drain contact structure and the elevated source contact structure that is exposed.

In this manner, the dopant, that is implanted into the exposed portions of the elevated drain contact structure and the elevated source contact structure, is prevented from being implanted into the drain facetted surface and the source facetted surface. Thus, the prior art formation of deeply doped junctions under the drain facetted surface and the source facetted surface resulting in short-channel effects is avoided with the present invention. Furthermore, silicide that is formed on the exposed portions of the elevated drain contact structure and the elevated source contact structure, is prevented from being formed on the drain facetted surface and the source facetted surface. Thus, the prior art formation of silicide on the drain facetted surface and the source facetted surface that is substantially near the drain extension implant and the source extension implant resulting in leakage current is avoided with the present invention.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 7:
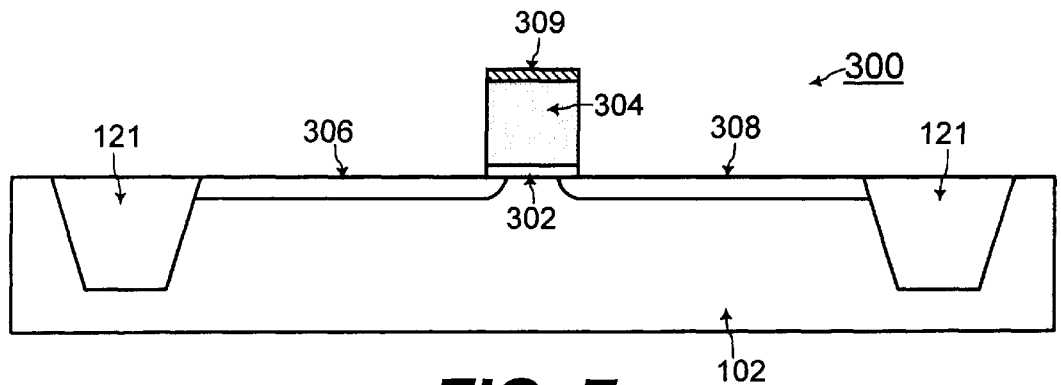
FIGS. 7, 8, 9, 10, 11, 12, 13, and 14 show cross-sectional views of a MOSFET fabricated according to an aspect of the present invention for illustrating the steps for formation of elevated drain and source contact structures with a second spacer that covers the drain and source facetted surfaces to prevent enhanced short-channel effects and leakage current in the MOSFET.

Referring to FIG. 7, for effective fabrication of a MOSFET (Metal Oxide Semiconductor Field Effect Transistor) 300 of the present invention having elevated drain and source contact structures, a gate dielectric 302 which is comprised typically of silicon dioxide ($SiO_2$) and a gate structure 304 which is typically a polysilicon gate is formed on the surface of the semiconductor substrate 102. A drain extension implant 306 and a source extension implant 308 are then formed to have a relatively large area such that elevated drain and source contact structures may be selectively grown thereon. Fabrication processes for formation of the gate dielectric 302, the gate structure 304, the drain extension implant 306, and the source extension implant 308 are known to one of ordinary skill in the art of integrated circuit fabrication.

According to an aspect of the present invention, a gate capping layer 309 is also formed on the gate structure 304. The gate capping layer 309 is typically comprised of silicon nitride (SiN) and prevents the growth of silicon on the gate structure 304 during selective epitaxial growth of the elevated drain and source contact structures on the drain extension implant 306 and the source extension implant 308. The gate capping layer 309 which is typically comprised of silicon nitride may have a thickness in the range of 150 Å (angstroms) to 200 Å (angstroms) according to one embodiment of the present invention. Fabrication processes for formation of the gate capping layer 309 are known to one of ordinary skill in the art of integrated circuit fabrication.

Figure 8:
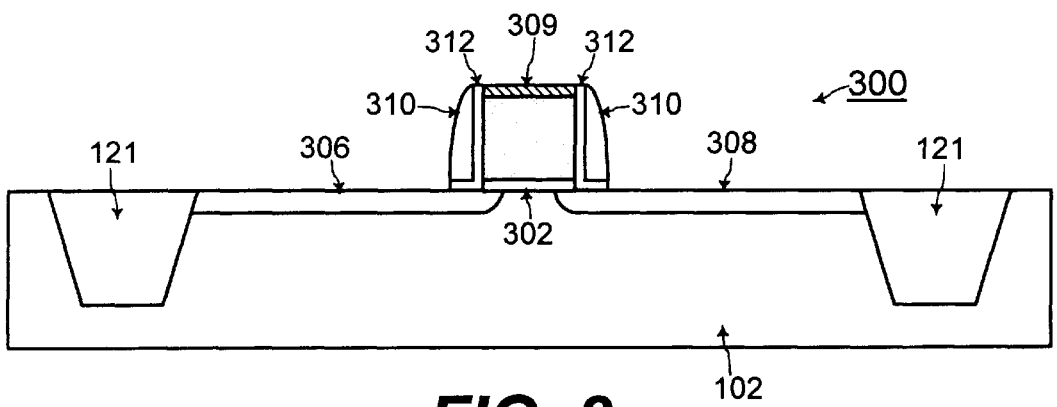

Referring to FIG. 8, a first spacer 310 is formed on the sidewalls of the gate structure 304 and the gate dielectric 302. The first spacer 310 is typically comprised of silicon nitride (SiN), and in that case, a spacer liner oxide 312 is deposited as a buffer layer between the first spacer 310 and the sidewalls of the gate structure 304 and the gate dielectric 302, and between the first spacer 310 and the surface of the drain extension implant 306 and the source extension implant 308. When the first spacer 310 is comprised of silicon nitride, the width of the first spacer 310 may be in the range of 200 Å (angstroms) to 400 Å (angstroms), and the thickness of the spacer liner oxide 312 may be in the range of 100 Å (angstroms) to 200 Å (angstroms), according to one embodiment of the present invention. Fabrication processes for formation of the first spacer 310 and the spacer liner oxide 312 as shown in FIG. 8 are known to one of ordinary skill in the art of integrated circuit fabrication.

Figure 9:
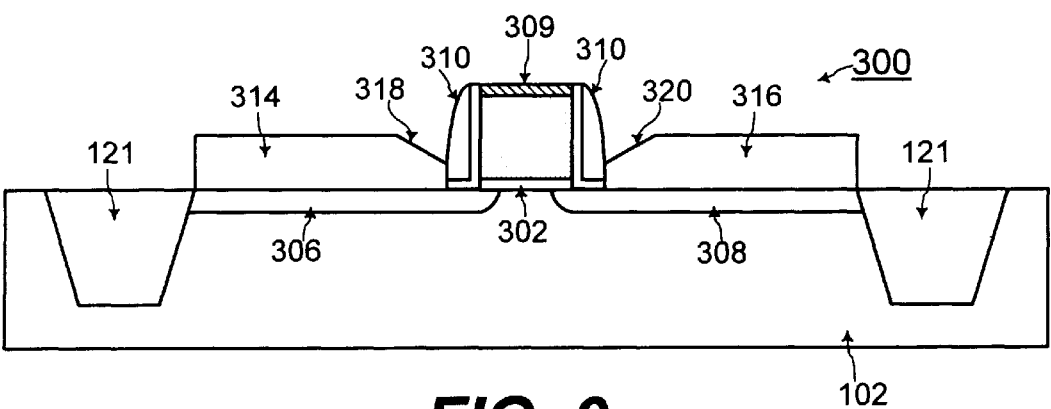

Referring to FIG. 9, an elevated drain contact structure 314 is grown onto the exposed portions of the drain extension implant 306 typically by selective epitaxial growth when the elevated drain contact structure 314 is comprised of silicon. Similarly, an elevated source contact structure 316 is grown onto the exposed portions of the source extension implant 308 typically by selective epitaxial growth when the elevated source contact structure 316 is comprised of silicon. The elevated drain contact structure 314 and the elevated source contact structure 316 may each have a thickness in the range of 400 Å (angstroms) to 600 Å (angstroms) according to one embodiment of the present invention. Fabrication processes for selective epitaxial growth of the elevated drain contact structure 314 and the elevated source contact structure 316 are known to one of ordinary skill in the art of integrated circuit fabrication.

Figure 1:
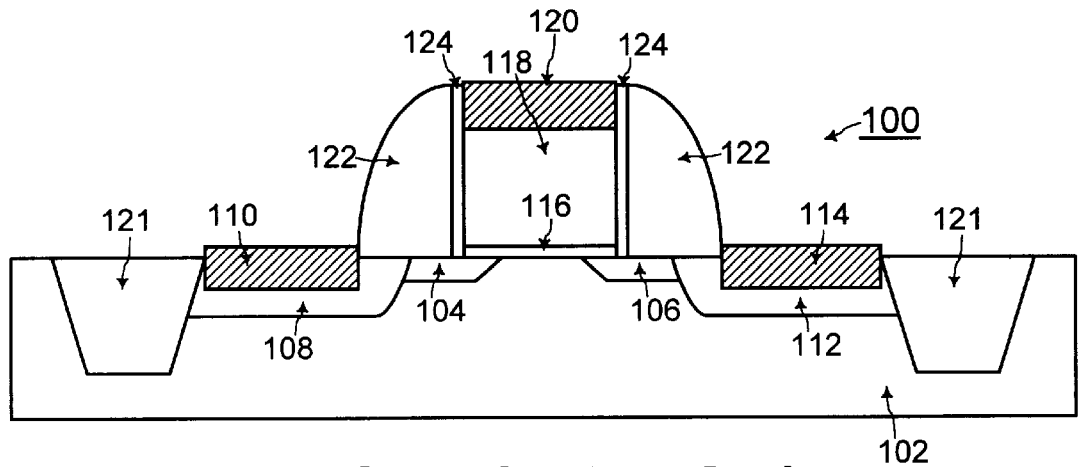
FIG. 1 shows a cross-sectional view of a conventional MOSFET (Metal Oxide Semiconductor Field Effect Transistor) having drain and source contact junctions and drain and source extension implants.
Figure 2:
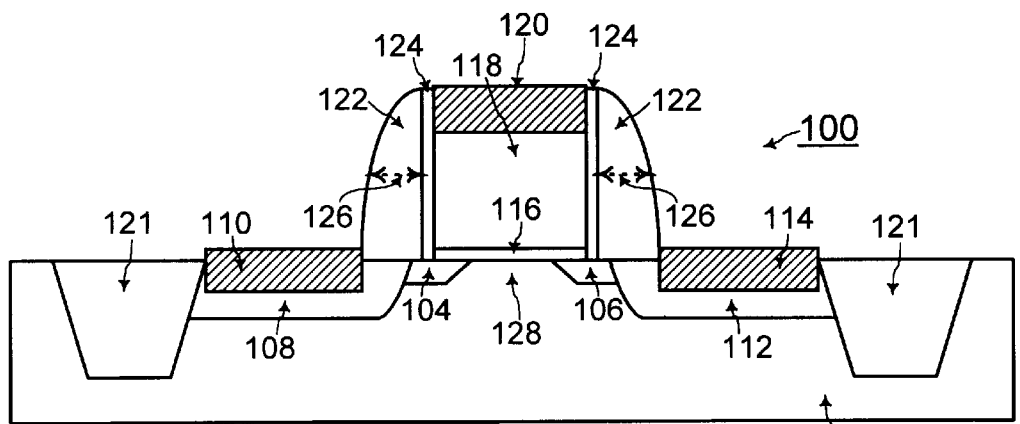
FIG. 2 shows a cross-sectional view of the conventional MOSFET of FIG. 1 with a narrow spacer structure surrounding the gate structure of the MOSFET.
Figure 3:
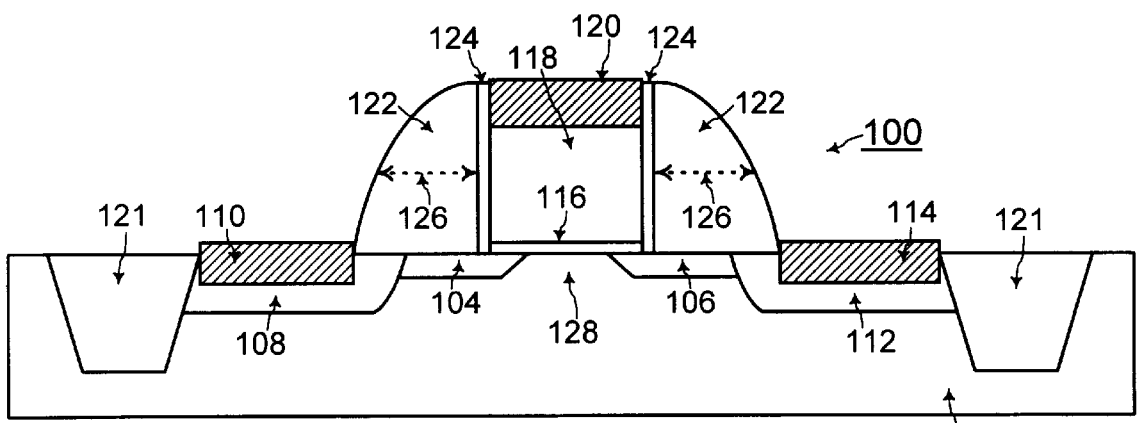
FIG. 3 shows a cross-sectional view of the conventional MOSFET of FIG. 1 with a wide spacer structure surrounding the gate structure of the MOSFET.
Figure 4:
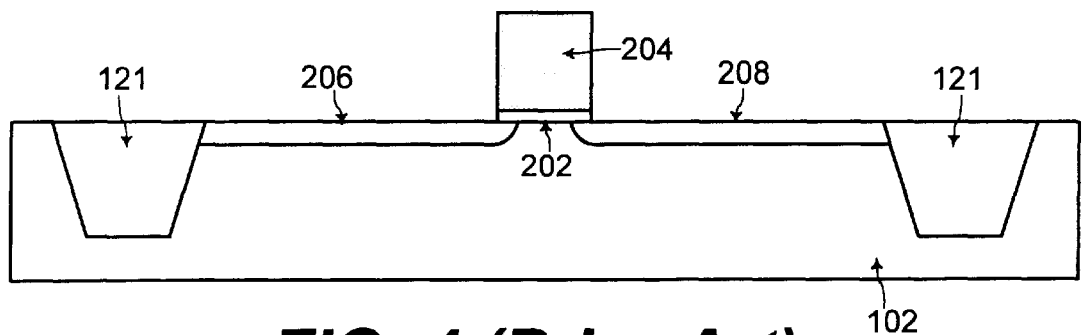
FIGS. 4, 5, and 6 show cross-sectional views of a MOSFET fabricated according to the prior art for illustrating the steps for formation of elevated drain and source contact structures with drain and source facetted surfaces resulting in enhanced short-channel effects and larger leakage current in the MOSFET.
Figure 5:
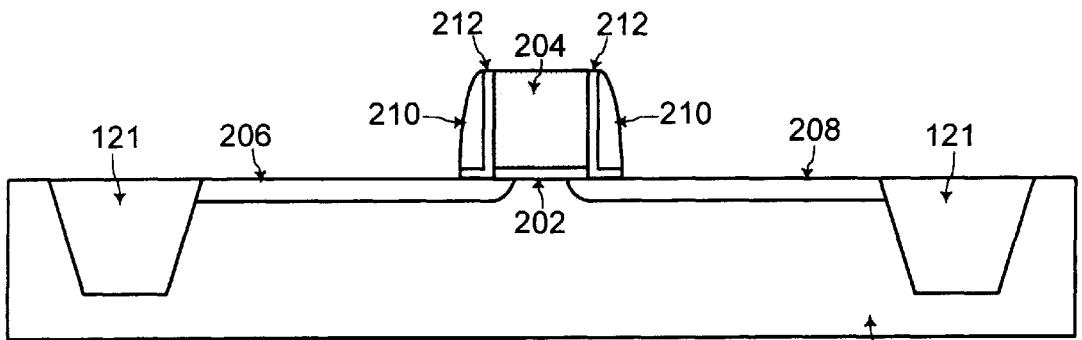
Figure 6:
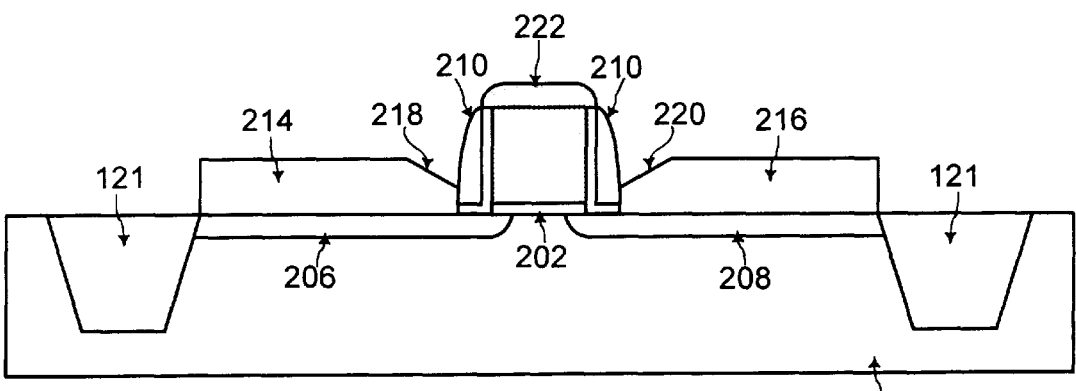

During the selective epitaxial growth of the elevated drain contact structure 314 on the drain extension implant 306 and of the elevated source contact structure 316 on the source extension implant 308, the gate capping layer 309 prevents growth of silicon on the gate structure 304. Thus, referring to FIGS. 6 and 9, the gate capping layer 309 of an aspect of the present invention prevents formation of a mushroom cap on top of the gate structure 304 such that the gate structure 304 does not turn into a mushroom shape.

Referring to FIG. 9, during the selective epitaxial growth of the elevated drain contact structure 314, a drain facetted surface 318 forms on the elevated drain contact structure 314 due to the crystalline structure of the elevated drain contact structure 314. The drain facetted surface 318 faces toward the first spacer 310 on the sidewall of the gate structure 304. Similarly, a source facetted surface 320 forms on the elevated source contact structure 316 due to the crystalline structure of the elevated source contact structure 316. The source facetted surface 320 faces toward the first spacer 310 on the sidewall of the gate structure 304.

Figure 10:
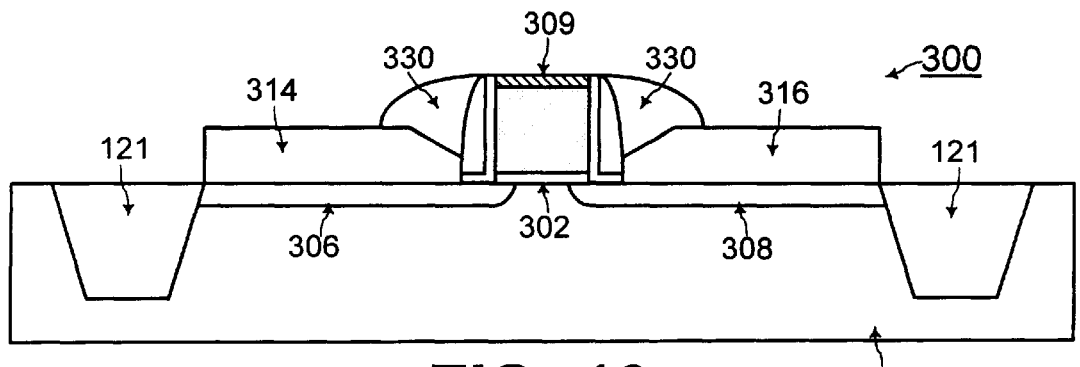

Referring to FIG. 10, according to an aspect of the present invention, before dopant is implanted and activated into the elevated drain contact structure 314 and the elevated source contact structure 316, a second spacer 330 is formed to cover the drain facetted surface 318 and the source facetted surface 320. In addition, according to a preferred embodiment of the present invention, the second spacer 330 covers the first spacer 310. The first spacer 310 and the gate capping layer 309 are typically comprised of silicon nitride (SiN), and the second spacer in that case is comprised of silicon dioxide ($SiO_2$).

Figure 11:
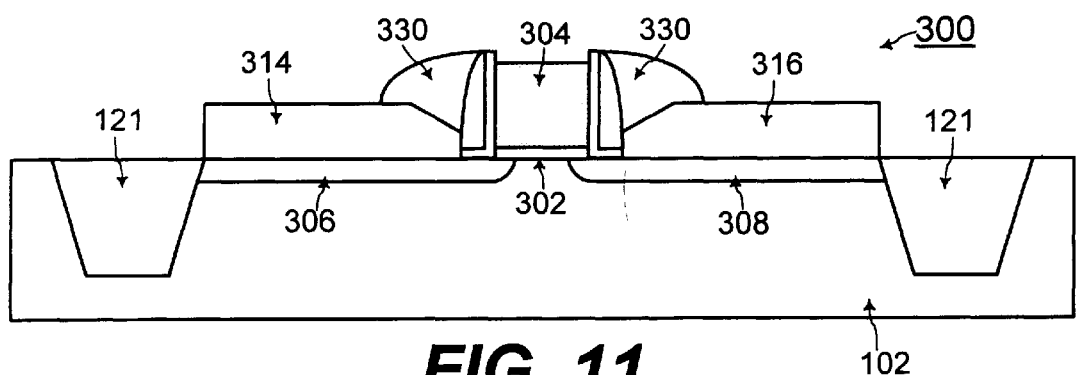

Referring to FIG. 11, the gate capping layer 309 is etched off from the top of the gate structure 304. A selective etching process, such as a wet chemical etch using hot phosphoric acid ($H_3PO_4$) or a dry plasma etch for example, is used such that the gate capping layer 309 comprised of silicon nitride (SiN) is selectively etched while the second spacer 330 comprised of silicon dioxide ($SiO_2$) is preserved. With such a selective etch process, since the second spacer 330 covers the first spacer 310 which may also be comprised of silicon nitride (SiN), the first spacer 310 is also preserved. Such selective etching processes are known to one of ordinary skill in the art of integrated circuit fabrication. Any other selective etching processes known to one of ordinary skill in the art of integrated circuit fabrication for selectively etching silicon nitride (SiN) while preserving silicon dioxide ($SiO_2$) may be advantageously used with the present invention.

Figure 12:
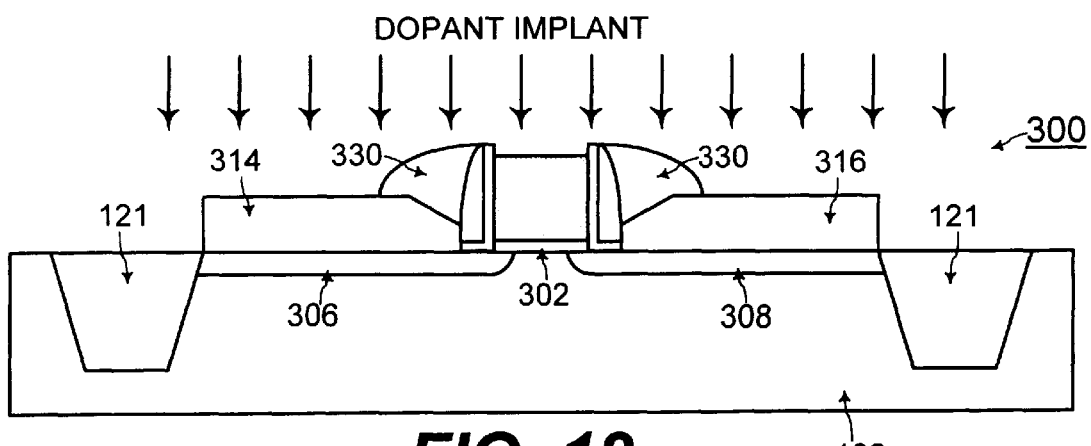

Referring to FIG. 12, a dopant implantation is performed to dope the elevated drain contact structure 314, the elevated source contact structure 316, and the gate structure 304. The dopant is an N-type dopant when the MOSFET 300 is an NMOSFET (N-channel Metal Oxide Semiconductor Field Effect Transistor). Alternatively, the dopant is a P-type dopant when the MOSFET 300 is a PMOSFET (P-channel Metal Oxide Semiconductor Field Effect Transistor). Such dopant implantation processes are known to one of ordinary skill in the art of integrated circuit fabrication.

Referring to FIG. 12, because the second spacer 330 covers the drain facetted surface 318 and the source facetted surface 320, the dopant does not reach near the semiconductor substrate 102. Thus, with the second spacer 330, locally deep junctions are not formed in the semiconductor substrate at the drain facetted surface 218 and the source facetted surface 220 in the MOSFET 300 of the present invention, and short-channel effects are prevented in the MOSFET 300 of the present invention.

The dopant implanted into the elevated drain contact structure 314, the elevated source contact structure 316, and the gate structure 304 is activated typically by a high-temperature (in the range of 1050° C. to 1100° C. in one embodiment of the present invention) RTA (Rapid Thermal Anneal) process. Such high-temperature RTA activation processes are known to one of ordinary skill in the art of integrated circuit fabrication.

Figure 13:
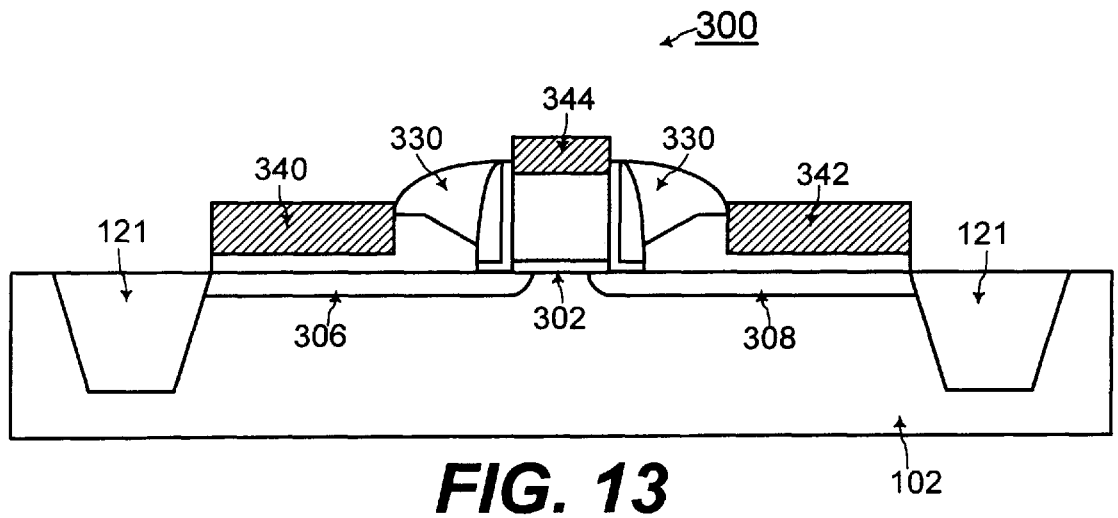

Referring to FIG. 13, a drain silicide 340 is formed on the elevated drain contact structure 314, a source silicide 342 is formed on the elevated source contact structure 316, and a gate silicide 344 is formed on the gate structure 304. Such silicides may be comprised of one of cobalt silicide ($CoSi_2$) or titanium silicide ($TiSi_2$) for example, and processes for formation of such silicides are known to one of ordinary skill in the art of integrated circuit fabrication.

Referring to FIG. 13, because the second spacer 330 covers the drain facetted surface 318 and the source facetted surface 320, silicide is not formed on the drain facetted surface 318 and the source facetted surface 320. Thus, with the second spacer 330, silicide is not formed close to the drain extension implant 306 and the source extension implant 308 in the MOSFET 300 of the present invention such that junction leakage current through the drain extension implant 306 and the source extension implant 308 is minimized.

Figure 14:
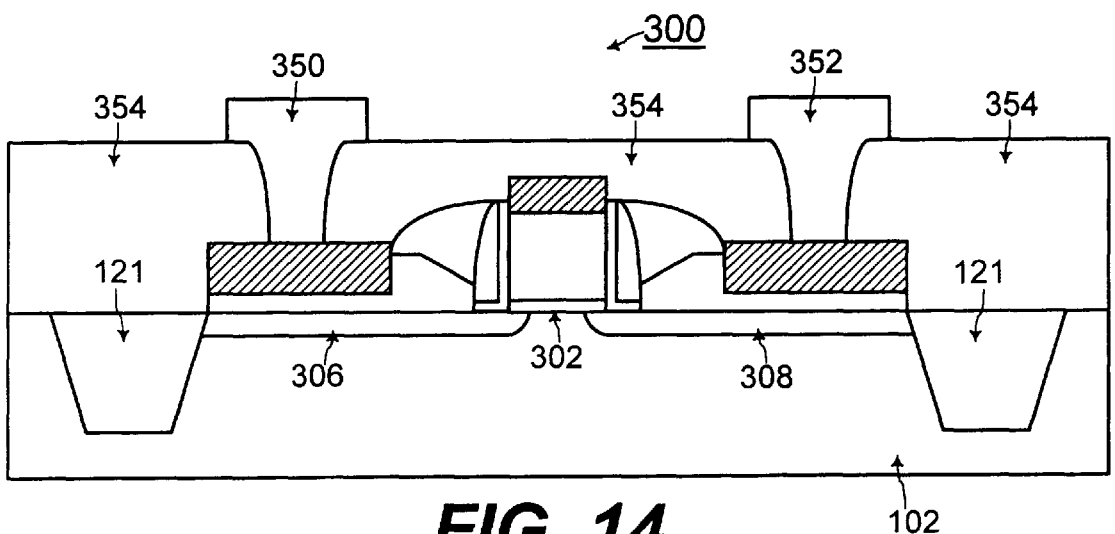

Referring to FIG. 14, conventional fabrication processes may follow for forming contacts and interconnects to the MOSFET 300 such as a drain contact 350 to provide connection to the drain silicide 340 and a source contact 352 to provide connection to the source silicide 342. Field oxides 354 may also be deposited for electrical isolation of the components of the MOSFET 300.

In this manner, elevated drain and source contact structures are fabricated for the MOSFET 300 while avoiding disadvantageous short-channel effects and leakage current from the facetted surfaces that form on the elevated drain and source contact structures. Thus, with effective formation of elevated drain and source contact structures in the present invention, the MOSFET 300 may advantageously be further scaled down to submicron and nanometer dimensions.

The foregoing is by way of example only and is not intended to be limiting. For example, the second spacer 330 may be comprised of any material, aside from just the example of silicon dioxide, that would substantially inhibit implantation of dopant from the drain facetted surface 318 and the source facetted surface 320 when the second spacer 330 covers the drain facetted surface 318 and the source facetted surface 320. The material for the second spacer 330 would also preferably prevent silicide formation at the drain facetted surface 318 and the source facetted surface 320 when the second spacer 330 covers the drain facetted surface 318 and the source facetted surface 320. In addition the material for the second spacer 330 would also preferably have a different etch rate from an etch rate of the material forming the first spacer 312.

Furthermore, as will be understood by those skilled in the art, the structures described herein may be made or used in the same way regardless of their position and orientation. Accordingly, it is to be understood that terms and phrases such as "top" and "sidewall" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor having a drain extension implant, a source extension implant, a gate dielectric, a gate structure disposed over said gate dielectric, and a first spacer disposed on sidewalls of said gate dielectric and of said gate structure, the method including the steps of:

A. selectively growing an elevated drain contact structure on said drain extension implant, said elevated drain contact structure having a drain facetted surface facing toward said first spacer on said sidewall of said gate structure;

B. selectively growing an elevated source contact structure on said source extension implant, said elevated source contact structure having a source facetted surface facing toward said first spacer on said sidewall of said gate structure;

C. forming a second spacer to cover said drain facetted surface and said source facetted surface;

D. doping said elevated drain contact structure and said elevated source contact structure that is exposed with a dopant, after said step C;

E. activating said dopant within said elevated drain contact structure and said elevated source contact structure;

F. forming silicide on said elevated drain contact structure and said elevated source contact structure that is exposed, after said step E;

forming a gate capping layer on said gate structure before said step A to prevent selective growth of said gate structure into a mushroom-shaped structure during said step A;

etching said gate capping layer on said gate structure, after said step C and before said step D;

doping said gate structure with said dopant during said step D;

activating said dopant within said gate structure during said step E; and forming silicide on said gate structure during said step F.

2. The method of claim 1, wherein said second spacer covers said first spacer disposed on said sidewalls of said gate structure such that said first spacer is not etched during said step of etching said gate capping layer.

3. The method of claim 2, wherein said first spacer is comprised of silicon nitride (SiN), wherein said gate capping layer is comprised of silicon nitride (SiN), and wherein said second spacer is comprised of silicon dioxide ($SiO_2$).

4. The method of claim 3, wherein said gate structure is comprised of polysilicon, and wherein said elevated drain contact structure is formed by selective epitaxial growth of silicon on said drain extension implant, and wherein said elevated source contact structure is formed by selective epitaxial growth of silicon on said source extension implant.

5. The method of claim 1, wherein said field effect transistor is a MOSFET (Metal Oxide Semiconductor Field Effect Transistor).

6. The method of claim 5, wherein said dopant is an N-type dopant for fabricating an NMOSFET (N-channel Metal Oxide Semiconductor Field Effect Transistor).

7. The method of claim 5, wherein said dopant is a P-type dopant for fabricating a PMOSFET (P-channel Metal Oxide Semiconductor Field Effect Transistor).

8. A method for fabricating a MOSFET (Metal Oxide Semiconductor Field Effect Transistor) having a drain extension implant, a source extension implant, a gate oxide, a polysilicon gate disposed over said gate oxide, and a first spacer comprised of silicon nitride disposed on sidewalls of said gate oxide and of said polysilicon gate, the method including the steps of:

A. forming a gate capping layer on said polysilicon gate;
B. growing an elevated drain contact structure by selective epitaxial growth of silicon on said drain extension implant, said elevated drain contact structure having a drain facetted surface facing toward said first spacer on said sidewall of said polysilicon gate;
C. growing an elevated source contact structure by selective epitaxial growth of silicon on said source extension implant, said elevated source contact structure having a source facetted surface facing toward said first spacer on said sidewall of said polysilicon gate;
wherein said gate capping layer prevents selective epitaxial growth of silicon on said polysilicon gate during said step B and said step C;
D. forming a second spacer of silicon dioxide to cover said drain facetted surface and said source facetted surface and to cover said first spacer comprised of silicon nitride on said sidewalls of said gate oxide and of said polysilicon gate;
E. etching said gate capping layer on said polysilicon gate after said step D, wherein said second spacer covers said first spacer such that said first spacer is not etched during said step of etching said gate capping layer;
F. doping said elevated drain contact structure and said elevated source contact structure that is exposed, and doping said polysilicon gate, with a dopant, said dopant being one of an N-type dopant for fabrication of an NMOSFET (N-channel Metal Oxide Semiconductor Field Effect Transistor) and of a P-type dopant for fabrication of a PMOSFET (P-channel Metal Oxide Semiconductor Field Effect Transistor);
G. activating said dopant within said elevated drain contact structure, said elevated source contact structure, and said polysilicon gate; and
H. forming silicide on said elevated drain contact structure and said elevated source contact structure that is exposed, and on said polysilicon gate.

* * * * *